(12) United States Patent
Bultan et al.

(10) Patent No.: US 7,865,158 B2
(45) Date of Patent: Jan. 4, 2011

(54) METHOD AND APPARATUS FOR AUTOMATICALLY CORRECTING RECEIVER OSCILLATOR FREQUENCY

(75) Inventors: Aykut Bultan, Bayside, NY (US); Jung-Lin Pan, Selden, NY (US); Rui Yang, Greenlawn, NY (US); Kenneth P. Kearney, Smithtown, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 293 days.

(21) Appl. No.: 11/299,502

(22) Filed: Dec. 12, 2005

(65) Prior Publication Data

US 2007/0058708 A1    Mar. 15, 2007

Related U.S. Application Data

(60) Provisional application No. 60/702,667, filed on Jul. 26, 2005.

(51) Int. Cl.
*H04B 1/18* (2006.01)
(52) U.S. Cl. .................... 455/192.2; 455/254; 455/257; 455/264; 455/265; 375/344
(58) Field of Classification Search ... 455/192.1–192.3, 455/254–266; 375/327, 344
See application file for complete search history.

(56) References Cited

U.S. PATENT DOCUMENTS

| | | | | | |
|---|---|---|---|---|---|
| 4,630,283 | A | * | 12/1986 | Schiff | 375/143 |
| 5,287,388 | A | * | 2/1994 | Ogura et al. | 375/344 |
| 5,361,276 | A | * | 11/1994 | Subramanian | 375/150 |
| 5,579,338 | A | * | 11/1996 | Kojima | 375/149 |
| 5,729,570 | A | * | 3/1998 | Magill | 375/149 |
| 5,812,523 | A | * | 9/1998 | Isaksson et al. | 370/208 |
| 5,818,882 | A | * | 10/1998 | Komatsu | 375/344 |
| 6,088,409 | A | * | 7/2000 | Naruse | 375/354 |
| 6,101,168 | A | * | 8/2000 | Chen et al. | 370/228 |
| 6,278,725 | B1 | * | 8/2001 | Rouphael et al. | 375/148 |
| 6,421,371 | B1 | * | 7/2002 | Sourour et al. | 375/142 |
| 6,510,187 | B2 | * | 1/2003 | Saito et al. | 375/344 |
| 6,597,728 | B1 | * | 7/2003 | Kondo | 375/149 |
| 6,625,197 | B1 | * | 9/2003 | Lundby et al. | 375/130 |

(Continued)

FOREIGN PATENT DOCUMENTS

EP    0 762 666    3/1997

(Continued)

*Primary Examiner*—Edward Urban
*Assistant Examiner*—RuiMeng Hu
(74) *Attorney, Agent, or Firm*—Volpe and Koenig, P.C.

(57) ABSTRACT

A method and apparatus for automatically correcting the frequency of a local oscillator of a receiver. A primary common pilot channel (CPICH) code sequence is generated by a CPICH code generator based on a reference cell identification signal and a frame start signal. The received despread CPICH code sequence is used to generate an estimated frequency error signal. A control voltage signal is generated by a control voltage generator based on the estimated frequency error signal. The CPICH code generator generates the CPICH code sequence based on signals received from a high speed downlink packet access (HSDPA) serving cell when HSDPA is active, or a timing reference cell when HSDPA is not active. The present invention achieves full maximum ratio combining gain when space time transmit diversity (STTD) is used, even without receiving a transmit diversity indication.

39 Claims, 3 Drawing Sheets

U.S. PATENT DOCUMENTS

| | | |
|---|---|---|
| 6,625,434 B1 | 9/2003 | Arimitsu et al. |
| 6,687,290 B1 * | 2/2004 | Okazaki ................. 375/226 |
| 6,704,555 B2 * | 3/2004 | Sih et al. ............... 455/245.1 |
| 6,731,911 B1 * | 5/2004 | Hirata et al. .............. 455/71 |
| 6,741,665 B2 * | 5/2004 | Kenney et al. ............ 375/344 |
| 6,816,540 B2 * | 11/2004 | Hirata ..................... 375/147 |
| 6,996,156 B1 * | 2/2006 | Ono ........................ 375/147 |
| 7,016,404 B2 * | 3/2006 | Yang ....................... 375/229 |
| 7,058,378 B2 * | 6/2006 | Grieco et al. .............. 455/255 |
| 7,061,996 B2 * | 6/2006 | Kim ........................ 375/321 |
| 7,076,008 B2 * | 7/2006 | Jeong ...................... 375/345 |
| 7,088,955 B2 * | 8/2006 | Challa et al. .............. 455/63.3 |
| 7,088,974 B2 * | 8/2006 | Hokao .................... 455/192.1 |
| 7,095,990 B2 * | 8/2006 | Kurihara ................. 455/130 |
| 7,095,993 B2 * | 8/2006 | You et al. ............... 455/192.2 |
| 7,190,940 B2 * | 3/2007 | Muralidhar et al. ......... 455/265 |
| 7,203,254 B2 * | 4/2007 | Carsello et al. ............ 375/334 |
| 7,269,236 B2 * | 9/2007 | Kumura ................... 375/344 |
| 7,299,023 B2 * | 11/2007 | Grieco et al. .............. 455/255 |
| 7,308,017 B2 * | 12/2007 | Jiang et al. ................ 375/140 |
| 7,315,590 B1 * | 1/2008 | Okuyama et al. ........... 375/344 |
| 7,369,633 B2 * | 5/2008 | Jiang et al. ................ 375/354 |
| 2001/0048724 A1 * | 12/2001 | Subramanian .............. 375/322 |
| 2002/0085652 A1 * | 7/2002 | Okubo et al. .............. 375/344 |
| 2002/0123316 A1 * | 9/2002 | Sih et al. ................. 455/245.1 |
| 2003/0142732 A1 * | 7/2003 | Moshavi et al. ............ 375/148 |
| 2003/0186666 A1 * | 10/2003 | Sindhushayana ............ 455/260 |
| 2003/0235258 A1 * | 12/2003 | Kenney et al. ............. 375/344 |
| 2004/0017843 A1 * | 1/2004 | Fitton et al. ................ 375/148 |
| 2004/0071116 A1 * | 4/2004 | You et al. .................. 370/335 |
| 2004/0081114 A1 | 4/2004 | Jiang et al. |
| 2004/0114675 A1 * | 6/2004 | Crawford .................. 375/149 |
| 2004/0174812 A1 * | 9/2004 | Murakami et al. .......... 370/215 |
| 2005/0043825 A1 * | 2/2005 | Aldridge et al. ............. 700/39 |
| 2005/0141655 A1 * | 6/2005 | Lee et al. .................. 375/344 |
| 2006/0171487 A1 * | 8/2006 | Nawa et al. ................ 375/326 |
| 2006/0188007 A1 * | 8/2006 | Daneshrad et al. .......... 375/148 |
| 2006/0286954 A1 * | 12/2006 | Fernandez-Corbaton et al. . 455/255 |
| 2007/0032213 A1 * | 2/2007 | Grieco et al. .............. 455/257 |

FOREIGN PATENT DOCUMENTS

| | | |
|---|---|---|
| EP | 1 416 638 | 5/2004 |
| JP | 2000-228656 | 8/2000 |
| JP | 2005-086336 | 3/2005 |
| WO | 03/096565 | 11/2003 |

* cited by examiner

US 7,865,158 B2

METHOD AND APPARATUS FOR AUTOMATICALLY CORRECTING RECEIVER OSCILLATOR FREQUENCY

CROSS REFERENCE TO RELATED APPLICATION

This application claims the benefit of U.S. Provisional Patent Application No. 60/702,667 filed on Jul. 26, 2005, which is incorporated by reference as if fully set forth.

FIELD OF INVENTION

The present invention is related to a wireless communication system. More particularly, the present invention is related to a method and apparatus for automatically correcting the frequency of a local oscillator (LO) used in a wireless receiver.

BACKGROUND

In a conventional wireless communication system including a receiver and a transmitter, an automatic frequency correction (AFC) algorithm is used by the receiver for the correction of carrier frequency offset and the sampling clock offset with respect to a transmitter. This is generally performed through the use of pilot signals. However, with the introduction of transmit diversity, high speed data packet access (HSDPA) and the macro-diversity in the wireless communication standards, the AFC algorithm must conform to more stringent requirements introduced by the HSDPA services.

HSDPA services employ higher constellation sizes to produce higher data rates. However, higher constellations are more sensitive to frequency errors. Therefore, HSDPA services require more robust AFC algorithm. On top of these challenges, the AFC algorithm may operate in a macro diversity environment where the receiver processes data from multiple cells at the same time. For example, in a third generation partnership project (3GPP) frequency division duplex (FDD) system, the receiver may receive data from six neighboring cells at the same time. In that case, there are different pilot signals from each cell.

The prior art does not require an AFC algorithm with HSDPA and multiple cell processing capabilities. In general, the prior art does not deal with transmit diversity during AFC initial lock in period (clock synchronization between a wireless transmit/receive unit (WTRU) and a base station). The transmit diversity processing is performed only after the transmit diversity existence is confirmed through the broadcast channel. Therefore, the transmit diversity processing does not contribute to the AFC algorithm during the initial convergence period. This increases the convergence time and decreases the probability of convergence.

The prior art has looser requirements as set by the standards for the transmit frequency error. This is generally sufficient for a receiver with small constellation sizes such as binary phase shift keying (BPSK) or quadrature phase shift keying (QPSK). However, higher constellations at and above 16 QPSK require more stringent requirements. For example, the 3GPP FDD standards require less than 0.1 ppm frequency error in the AFC algorithm. The HSDPA services are noticeably degraded after the frequency error exceeds 0.05 ppm. This requirement forces the AFC algorithm to make efficient usage of the transmit diversity and the macro diversity which were either ignored or unnecessary in the prior art.

SUMMARY

The present invention is related to a method and apparatus for automatically correcting the frequency of an oscillator in an analog radio by generating a voltage controlled oscillator (VCO) control voltage signal. AFC algorithm in accordance with the present invention uses a common pilot channel (CPICH) as a reference signal to measure the frequency error in the WTRU.

A primary CPICH code sequence is generated by a CPICH code generator based on a reference cell identification signal and a frame start signal. The received despread CPICH sequence is used to generate an estimated frequency error signal. The control voltage signal is generated by a control voltage generator based on the estimated frequency error signal. The CPICH code generator generates the CPICH code sequence based on signals received from an AFC reference cell. The AFC reference cell may be an HSDPA serving cell when HSDPA service is active, or may be a timing reference cell when HSDPA service is not active. Alternatively, a fixed reference cell can be used for AFC algorithm without any switching between the CPICH reference codes corresponding to different cells. The present invention achieves full maximum ratio combining (MRC) gain when space time transmit diversity (STTD) is used, even without receiving a transmit diversity indication. This can be used by any Alamouti based transmit diversity scheme.

BRIEF DESCRIPTION OF THE DRAWINGS

A more detailed understanding of the invention may be had from the following description of a preferred embodiment, given by way of example and to be understood in conjunction with the accompanying drawing wherein.

DETAILED DESCRIPTION OF THE PREFERRED EMBODIMENTS

Hereafter, the terminology "WTRU" includes but is not limited to a user equipment, mobile station, fixed or mobile subscriber unit, pager, or any other type of device capable of operating in a wireless environment.

The features of the present invention may be incorporated into an integrated circuit (IC) or be configured in a circuit comprising a multitude of interconnecting components.

Figure 1:
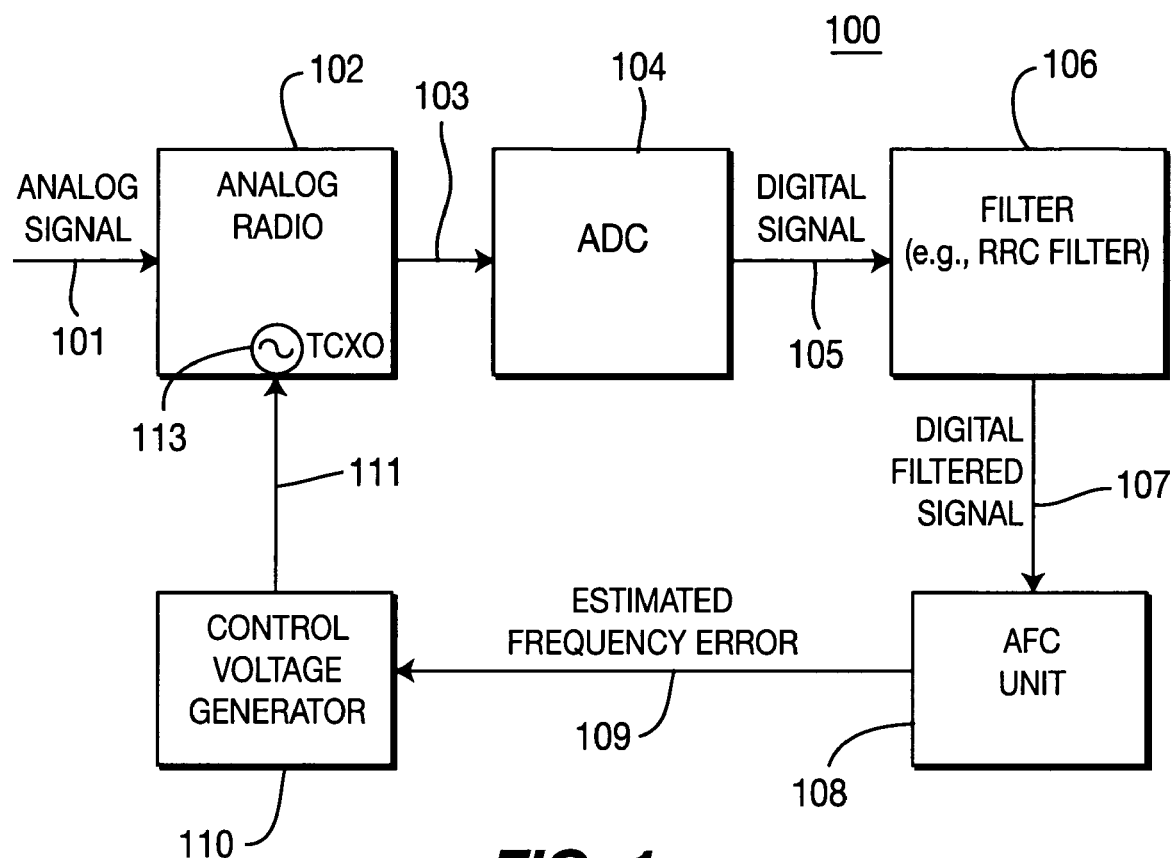
FIG. 1 is a simplified block diagram of a receiver including an AFC unit and control voltage generator in accordance with the present invention.

FIG. 1 is a simplified block diagram of a receiver 100 including an analog radio 102 with a voltage controlled temperature compensated crystal oscillator (TCXO) 113, an analog-to-digital converter (ADC) 104, a filter 106, (e.g., a root raised cosine (RRC) filter), an AFC unit 108 and a control voltage generator 110 which controls the frequency of the TCXO in accordance with the present invention. A received radio frequency (RF) signal 101 through the antenna (not shown) is processed by the analog radio 102 to generate a baseband signal by mixing the received RF signal with a signal generated using the TCXO 113. The baseband signal 103 is converted to a digital signal 105 by the ADC 104. The digital signal 105, which is preferably 2× over-sampled signal, is input to the filter 106, (for pulse shaping), which outputs the filtered digital signal 107 to the AFC unit 108. It should be noted that 2× sampling rate is an example and any sampling rate may be implemented. The AFC unit 108 generates an estimated frequency error signal 109. The estimated frequency error signal 109 is converted to a TCXO control voltage signal 111 by the control voltage generator 110.

The frequency of the TCXO 113 in the analog radio 102 is determined based on the TCXO control voltage signal 111. The frequency of the ideal TCXO 113, is proportional to the TCXO control voltage signal 111 as follows:

$$f_{TCXO} = \lambda \cdot V_{cont} \qquad \text{Equation (1)}$$

where λ is the slope of the TCXO control curve which is determined by the particular TCXO being used, $f_{TCXO}$ is TCXO frequency and $V_{cont}$ is the TCXO control voltage.

In general, the frequency difference between LOs of the transmitter and the receiver in a universal terrestrial radio access (UTRA) FDD system may be as large as ±3 ppm. This corresponds to a frequency error of approximately 6 kHz at carrier frequencies near 2 GHz.

In accordance with the present invention, an AFC algorithm is based on the difference of successive phase estimates. The AFC algorithm may be implemented in different rates depending on system requirements. For example, the AFC algorithm may be implemented in three different modes: fast, slow and freeze. In the fast mode, the AFC algorithm updates the frequency error estimate faster than the slow mode. In the freeze mode, the AFC algorithm keeps the last frequency error estimate until the freeze mode is over, (i.e., the frequency error estimate will remain the same during freeze). The freeze mode may be used for compressed mode and other special cases.

In 3GPP FDD Release 5, macro diversity is supported. Thus, a WTRU can receive and demodulate signals from up to six different cells in the active cell list. In accordance with the present invention, macro diversity processing is supported in a simplified way In the receiver 100 of FIG. 1, the AFC unit 108 processes only one cell at any given time. The cell is either an HSDPA serving cell or a timing reference cell. However, any cell can be used by this algorithm without any modification of the signal processing flow. The HSDPA serving cell is the cell that transmits high speed packet data to the WTRU and the timing reference cell is the cell where the WTRU receives all other services such as voice communications. These cells may be the same cell or a different cell.

If HSDPA is active, the AFC unit 108 processes only signals from the HSDPA serving cell. This means that the frequency is synchronized to the HSDPA serving cell. If HSDPA is not active, then the AFC unit 108 only processes signals from the timing reference cell. The AFC reference cell, (i.e., either the HSDPA serving cell or the timing reference cell), can only be changed just after the TCXO 113 of the analog radio 102 is updated by the TCXO control voltage signal 111 output by the control voltage cell 110, and before the processing for a new update begins.

Preferably, the AFC unit 108 uses a primary CPICH as a reference channel to measure the carrier frequency error in the received signal. It should be noted that any type of channels transmitting a sequence known to both the transmitter and the receiver may be utilized. The CPICH may be transmitted with STTD on or off. Although the AFC unit 108 makes use of the transmit diversity in the CPICH, it does not need the transmit diversity indicator.

A STTD is a practical application of Alamouti transmit diversity method. The Alamouti transmit diversity is very popular since it has a very simple processing in the receiver. However, this processing does not apply when there is a big frequency offset between adjacent symbols or when the transmit diversity information is unknown. The AFC algorithm in accordance with the present invention obtains full MRC gain of the STTD scheme without a transmit diversity indicator. This is obtained through quadruple processing and discarding the first and last symbols per frame. Quadruple processing is a process for producing one phase error estimate from four successive CPICH symbols.

Figure 2:
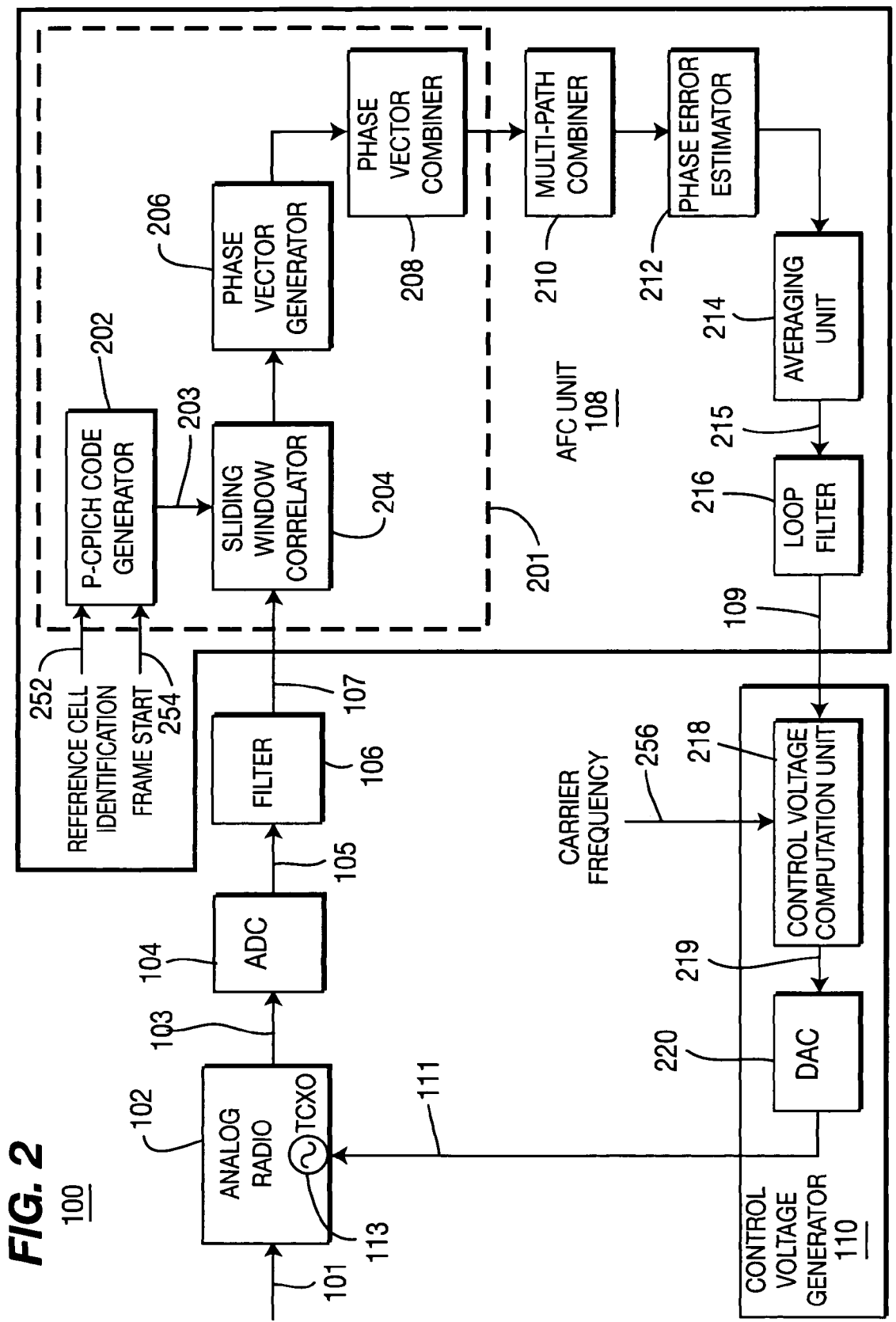
FIG. 2 is a block diagram of the receiver of FIG. 1 which shows details of the configuration of the AFC unit and the control voltage generator.

FIG. 2 is a block diagram of the receiver 100 of FIG. 1 which shows details of the configuration of the AFC unit 108 and the control voltage generator 110. In accordance with the present invention, the AFC unit 108 includes an AFC subunit 201 which includes a CPICH code generator 202, a sliding window correlator 204, a phase vector generator 206 and a phase vector combiner 208. The AFC unit 108 further includes a multi-path combiner 210, a phase error estimator 212, an averaging unit 214 and a loop filter 216.

In the AFC unit 108, an AFC algorithm is performed continuously after completion of the initial cell search. A reference cell identification signal 252, (i.e., a cell ID of an HSDPA serving cell or a timing reference cell) and a frame start signal 254 are input to the CPICH code generator 202. The AFC unit 108 starts up after the frame start signal 254 is provided. The P-CPICH code generator 202 generates a CPICH code sequence 203 based on a primary scrambling code sequence of the reference cell. The CPICH code generator 202 is reset every frame and operates at 1× the chip rate. The CPICH code generator 202 creates a complex CPICH code sequence 203 corresponding to antenna 1 independent of whether the STTD is on or off.

The CPICH code sequence 203 is input to the sliding window correlator 204. The sliding window correlator 204 computes a complex correlation between the filtered digital signal 107 and the CPICH code sequence 203 at successive points in time.

For each CPICH symbol, a sliding window complex correlation is preferably performed at every possible multipath location. The AFC unit 108 processes multiple successive CPICH symbols. For example, the sliding window correlator 204, the phase vector generator 206 and the phase vector combiner 208 may be configured to process every four CPICH symbols, (a quadruple). Hereinafter, the present invention will be explained with reference to the case of four symbols and universal mobile telecommunication services (UMTS) system as an example. However, it should be noted that the following description, (especially numerical description), is provided only for illustration purposes, not as a limitation, and the any number can be implemented, (e.g., any number of symbols can be processed as a basis for generating a phase error signal).

In UMTS, one frame comprises 15 time slots and each time slot comprises 2,560 chips and a CPICH symbol sequence is spread with spreading factor of 256. Therefore, 10 CPICH symbols are transmitted in each time slot and 150 symbols are transmitted in each frame. The symbols are preferably, but not necessarily, taken beginning from the second symbol in each frame. The first and the last symbols in each frame are discarded and the remaining 148 symbols, (which comprise 37 quadruples), are processed by the sliding window correlator 204 by quadruple by quadruple.

Figure 3:
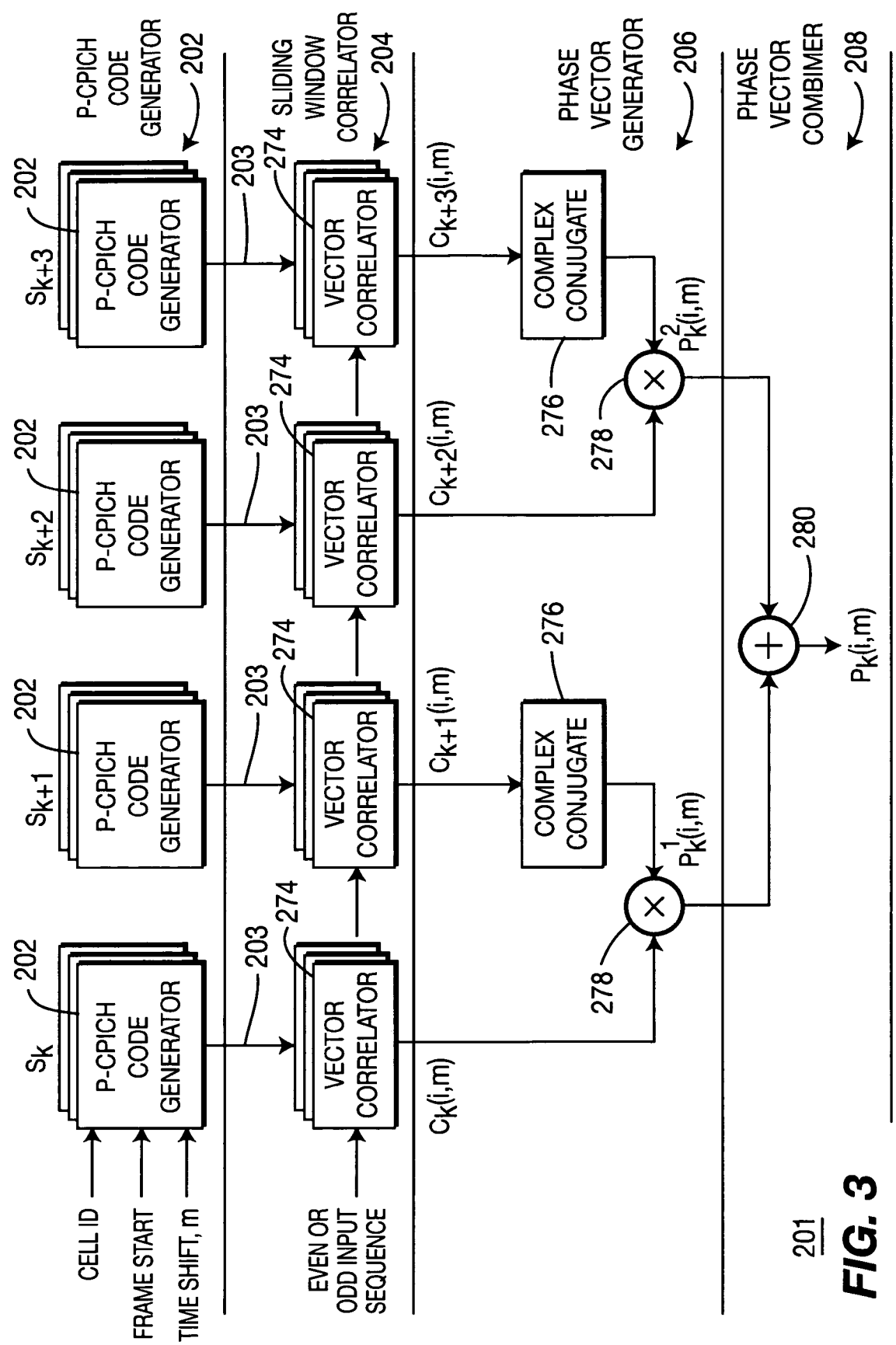
FIG. 3 is a block diagram of an AFC subunit of the receiver of FIG. 1.

FIG. 3 is a block diagram of the AFC subunit 201 of the AFC unit 108 of the receiver 100. As shown in FIG. 3, the sliding window correlator 204 preferably includes a plurality of vector correlators 274, each assigned to a particular position of a multipath component. Each vector correlator 274 processes the CPICH code sequence 203 generated by an associated CPICH code generator 202.

As shown in FIG. 3, the successive CPICH symbols are represented by $S_k$, $S_{k+1}$, $S_{k+2}$ and $S_{k+3}$, where k is the symbol index. The corresponding complex correlation values for these symbols are represented by $C_k(m)$, $C_{k+1}(m)$, $C_{k+2}(m)$ and $C_{k+3}(m)$, respectively, where index m represents the integer multi-path location. The complex correlations can be represented as follows:

$$C_k(m) = \sum_{n=k*256}^{(k+1)256-1} r(n)p*(n-m); \quad \text{Equation (2)}$$

$$C_{k+1}(m) = \sum_{n=(k+1)*256}^{(k+2)256-1} r(n)p*(n-m); \quad \text{Equation (3)}$$

$$C_{k+2}(m) = \sum_{n=(k+2)*256}^{(k+3)256-1} r(n)p*(n-m); \quad \text{Equation (4)}$$

$$C_{k+3}(m) = \sum_{n=(k+3)*256}^{(k+4)256-1} r(n)p*(n-m); \quad \text{Equation (5)}$$

where k=2, 6, 10, 14 ... 146, m=−5, −4, ..., 0, 1, ... 50 r(n) represents the despread input sequence, p(n−m) represents the pilot sequence corresponding to time-shift m and n represents discrete time index. As seen from Equations (2) through (5), for each symbol there are 56 complex correlations performed for each of even and odd sequences.

The phase vector generator 206 comprises a complex conjugate unit 276 and a multiplier 278. The complex conjugate unit 276 generates complex conjugate of vector correlation of one of the two consecutive symbols in a quadruple, such as two symbols $S_{k+1}$ and $S_{k+3}$. The multiplier 278 multiplies the vector correlation of $S_k$ and complex conjugate of the vector correlation of $S_{k+1}$ to generate a phase vector $P^1$ and multiplies the vector correlation of $S_{k+2}$ and complex conjugate of the vector correlation of $S_{k+3}$ to generate a phase vector $P^2$. The input rate of the phase vector generator is $1/T_s$, and the output rate is $1/2T_s$ where $T_s$, is the CPICH symbol rate.

The phase vectors $P^1$ and $P^2$ accounts for a phase error corresponding to the phase difference between two symbols, (i.e., 256 chips). The phase vectors $P^1$ and $P^2$ are obtained as follows:

$$P_k^1(m) = C_k(m)C_{k+1}^*(m), \quad \text{Equation (6)}$$

$$P_k^2(m) = C_{k+2}(m)C_{k+3}^*(m) \quad \text{Equation (7)}$$

The phase vector combiner 208 comprises an adder 280. The adder 280 adds the two phase vectors $P^1$ and $P^2$ in each quadruple. Therefore, for each quadruple, one combined phase vector is generated as follows:

$$P_k(m) = P_k^1(m) + P_k^2(m). \quad \text{Equation (8)}$$

The input rate of the phase vector combiner is $1/2T_s$, and the output rate is $1/4T_s$. When transmit diversity is on, this operation corresponds to adding in-phase and out-of-phase components from two antennas. If there is no transmit diversity, this corresponds to adding two successive phase vectors corresponding to a single antenna.

In either case the above equations result in full processing gain. This means when there is transmit diversity it performs like an MRC and when there is no transmit diversity there is no loss due to quadruple processing. This is achieved without knowing the transmit diversity indicator (whether transmit diversity on or off).

For each quadruple, (i.e., four successive symbols), this operation, (i.e., correlation, phase vector generation and phase vector combining), is repeated.

Referring to FIG. 2, the multipath combiner 210 combines the combined phase vectors corresponding to different multipath locations for both even and odd sequences. The purpose of the multipath combiner 210 is to eliminate weak multipath components and combine only the strongest ones. All the combined phase vectors are compared to a threshold in magnitude and only the ones having a magnitude greater than the threshold are combined and others are discarded. The threshold may be defined based on the strongest combined phase vector. The strongest one, $P_{max}$, among all the paths is defined as follows:

$$|P_{max}(k)| = \max_m |(P_k(m)|, \quad \text{Equation (9)}$$

where m=−5, −4, −3, −2, −1, 0, 1, 2, ... 50. The maximum is found at a rate of one fourth of the symbol rate ($1/4T_s$). The threshold may be defined by multiplying a scale factor to the maximum as follows:

$$m \in M \Leftrightarrow |P_m| \geq (\text{afc\_path\_thresh}) \times |P_{max}|. \quad \text{Equation (10)}$$

The magnitude may be calculated using the following approximation formula:

$$abs_{approx}\{z\} = \max(|Re\{z\}|, |Im\{z\}|) + \tfrac{1}{2}\min(|Re\{z\}|, |Im\{z\}|). \quad \text{Equation (11)}$$

The multipath combined vector, P, is simply the coherent addition of all the phase vectors above the threshold as follows:

$$P_k = \sum_{m \in M} P_k(m) \quad \text{Equation (12)}$$

The input and output rate of the combiner is $1/4T_s$.

The phase error estimator 212 calculates the phase angle of the combined phase vector, P. The phase angle of the phase vector is equal to inverse tangent of its argument. A coarse approximation may be used for the phase error. This approximation produces accurate results only for small phase angles. However, that is the only time its accuracy actually matters. The phase error, $\Delta\theta$, is given by:

$$\Delta\theta \approx \frac{Im\{P_{av}\}}{abs_{approx}\{P_{av}\}}. \quad \text{Equation (13)}$$

The input and output rate of the phase error estimator 212 is $1/4T_s$.

The estimated phase error is averaged by the averaging unit 214 over multiple frames before being passed to the loop filter 216. The averaging is as follows:

$$\Delta\hat{\theta} = \frac{1}{M_{av}} \sum_{M_{av}} \Delta\theta. \qquad \text{Equation (14)}$$

The averaging time depends on the AFC mode. For example, in the fast mode, averaging time may be two frames corresponding to 74 quadruples, (i.e., $M_{av}$=74). In the slow mode, averaging time may be twenty frames corresponding to 740 quadruples, (i.e., $M_{av}$=740).

After the averaging period is completed, the average phase error is reset before the next averaging period. The input rate to the averaging unit 214 is $1/4T_s$ and output rate is either every two frames or every 20 frames.

Figure 4:
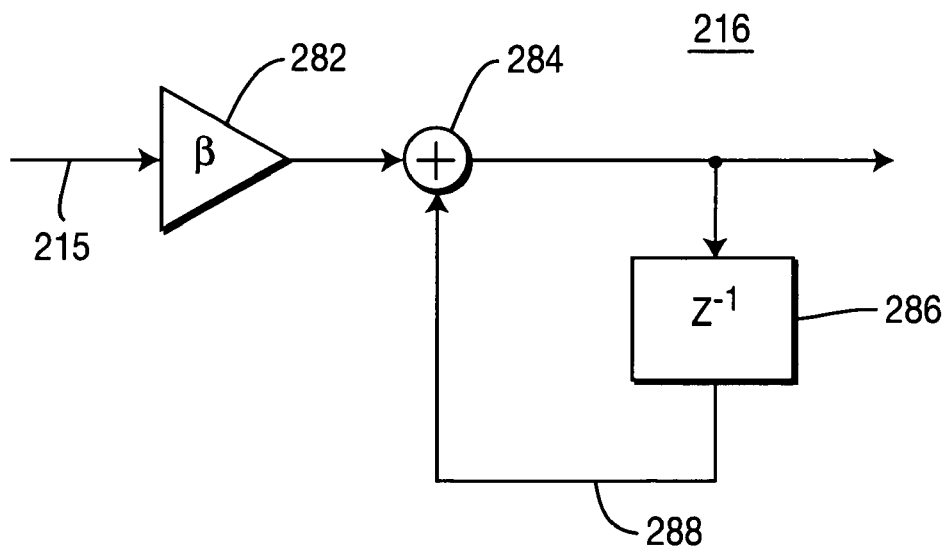
FIG. 4 is a diagram of a loop filter in the AFC unit of the receiver of FIG. 1.

The loop filter 216 is a weighted integrator as shown in FIG. 4. The output 215 from the averaging unit 214 is multiplied by a coefficient β 282 and integrated by an adder 284 and a delay unit 286. The output of the loop filter 216 can be written as follows:

$$\Delta\tilde{\theta} = \beta \cdot \sum \Delta\hat{\theta}. \qquad \text{Equation (15)}$$

The input and output rates of the loop filter 216 are same, either every two or twenty frames depending on the AFC mode of operation.

Referring again to FIG. 2, the control voltage generator 110 includes a control voltage computation unit 218 and a digital-to-analog converter (DAC) 220. The estimated phase error signal 109 output from the loop filter 216 and an assigned receiver carrier frequency 256 are input to the control voltage computation unit 218. The control voltage computation unit 218 calculates a frequency correction value. The frequency correction value 219 is simply the phase error divided by the time duration between successive two symbols. Therefore, the frequency correction value 219 is computed as follows:

$$f_o = \frac{\Delta\tilde{\theta}}{T_s}, \qquad \text{Equation (16)}$$

where $T_s$ is the symbol duration. The frequency correction value 219 is then converted to a digital-to-analog converter (DAC) step length, which becomes the TCXO control voltage signal 111. For example, the DAC 220 may have 12 bits resolution and, therefore, 4096 levels. Assuming that the approximate dynamic range of the TCXO is ±8 ppm corresponding to ±16 kHz or a total of 32 kHz for 2 GHz carrier frequency, the digital-to-analog converter (DAC) step size, δ, equals to 32000/4096=7.81 Hz. The TCXO control voltage signal 111 is simply found by:

$$V_{TCXO} = \left[ \frac{f_o}{\lambda \cdot \delta} \right], \qquad \text{Equation (17)}$$

where λ is the slope of the TCXO control curve as shown in Equation (1). It has been assumed that λ=1. However, λ may have a value determined by the physical TCXO 113 being used. The value λ should be included in the total loop gain. Therefore, after a practical average value for $\tilde{\lambda}$ is determined by the particular TCXO 113 being used, the loop filter coefficient, $\tilde{\beta}$, should be adjusted as follows:

$$\tilde{\beta} = \beta \cdot \tilde{\lambda}. \qquad \text{Equation (18)}$$

The TCXO control voltage signal 111 is applied to the TCXO 113 in the analog radio 102, (for example, every two or twenty frames depending on the fast or slow mode of operation, respectively).

Although the features and elements of the present invention are described in the preferred embodiments in particular combinations, each feature or element can be used alone without the other features and elements of the preferred embodiments or in various combinations with or without other features and elements of the present invention.

What is claimed is:

1. A method of automatically correcting frequency of a local oscillator of a receiver, the method comprising:
converting a received radio frequency (RF) signal to a baseband signal using a signal generated by the local oscillator, the frequency of the local oscillator being controlled by a control voltage signal;
generating samples of the baseband signal;
generating a pilot code sequence corresponding to a plurality of consecutive pilot symbols;
generating a complex correlation of samples and a pilot code sequence for each of 4N consecutive pilot symbols, N being a positive integer;
generating a phase vector corresponding to a phase difference between two consecutive pilot symbols, thereby generating 2N phase vectors;
generating a combined phase vector by combining the 2N phase vectors, wherein when space time transmit diversity (STTD) is used, in-phase and out-of-phase components from two antennas are added to generate the combined phase vector, and when STTD is not used, two successive phase vectors corresponding to a single antenna are added to generate the combined phase vector;
generating a phase error signal based on the combined phase vector; and
generating the control voltage signal based on the phase error signal.

2. The method of claim 1 further comprising:
averaging the phase error signal; and
accumulating the averaged phase error signal, wherein the control voltage signal is generated based on the accumulated averaged phase error signal.

3. The method of claim 1 wherein the control voltage signal generation comprises:
generating a frequency correction value from the phase error signal; and
generating the control voltage signal by converting the frequency correction value to a corresponding analog value with a digital-to-analog converter (DAC).

4. The method of claim 1 wherein the pilot code sequence is generated corresponding to an automatic frequency correction (AFC) reference cell.

5. The method of claim 4 wherein the AFC reference cell is a high speed downlink packet access (HSDPA) serving cell on a condition that HSDPA service is active.

6. The method of claim 4 wherein the AFC reference cell is a timing reference cell on a condition that high speed downlink packet access (HSDPA) service is not active.

7. The method of claim 1 wherein space time transmit diversity (STTD) is used in transmission of the pilot symbols.

8. The method of claim 7 wherein maximum ratio combining (MRC) is achieved without receiving a transmit diversity indication.

9. The method of claim 7 wherein the STTD is implemented by Alamouti transmit diversity.

10. The method of claim 1 wherein the pilot code sequence is a primary common pilot channel (CPICH) code sequence.

11. The method of claim 1 wherein samples corresponding to every four consecutive pilot symbols are processed to generate the phase error signal.

12. A receiver configured to automatically correct frequency error of a local oscillator of the receiver, the receiver comprising:
   an analog radio for converting a received radio frequency (RF) signal to a baseband signal using a signal generated by the local oscillator, the frequency of the local oscillator being controlled by a control voltage signal;
   an analog-to-digital converter (ADC) for generating samples of the baseband signal;
   an automatic frequency correction (AFC) unit comprising:
      a pilot code sequence generator for generating a pilot code sequence corresponding to a plurality of consecutive pilot symbols;
      a plurality of sliding window correlators for generating a complex correlation of samples and a pilot code sequence for each of the 4N consecutive pilot symbols, N being a positive integer;
      a plurality of phase vector generators, each phase vector generator generating a phase vector corresponding to a phase difference between two consecutive pilot symbols, thereby generating 2N phase vectors;
      a phase vector combiner for generating a combined phase vector by combining the 2N phase vectors, wherein in-phase and out-of-phase components from two antennas are added to generate the combined phase vector when space time transmit diversity (STTD) is used, and two successive phase vectors corresponding to a single antenna are added to generate the combined phase vector when STTD is not used; and
      a phase error estimator for generating the phase error signal based on the combined phase vector; and
   a control voltage generator in communication with the analog radio and the AFC unit, the control voltage generator for generating the control voltage signal based on the phase error signal.

13. The receiver of claim 12 wherein the AFC unit further comprises:
   an averaging unit for averaging the phase error signal generated by the phase error estimator; and
   a loop filter for accumulating the averaged phase error signal, wherein the control voltage signal is generated based on the accumulated averaged phase error signal.

14. The receiver of claim 12 wherein the AFC unit comprises a multipath combiner to combine phase vectors for a plurality of detected multipath components, and the phase error signal is generated based on the combined phase vectors over all detected multipath components.

15. The receiver of claim 12 wherein the control voltage generator comprises:
   a control voltage computation unit for generating a frequency correction value based on the phase error; and
   a digital-to-analog converter (DAC) for generating the control voltage signal based on the frequency correction value.

16. The receiver of claim 12 wherein each of the pilot code sequence generators generates the pilot code sequence signal corresponding to an AFC reference cell.

17. The receiver of claim 16 wherein the AFC reference cell is a high speed downlink packet access (HSDPA) serving cell on a condition that HSDPA service is active.

18. The receiver of claim 16 wherein the AFC reference cell is a timing reference cell on a condition that high speed downlink packet access (HSDPA) service is not active.

19. The receiver of claim 12 wherein space time transmit diversity (STTD) is used in transmission of the pilot symbols.

20. The receiver of claim 19 wherein maximum ratio combining (MRC) is achieved without receiving a transmit diversity indication.

21. The receiver of claim 19 wherein the STTD is implemented by Alamouti transmit diversity.

22. The receiver of claim 12 wherein the pilot code sequence is a primary common pilot channel (CPICH) code sequence.

23. The receiver of claim 12 wherein each of the pilot code sequence generators is reset every time a frame start signal indicates that a new frame is starting.

24. The receiver of claim 12 wherein each of the pilot code sequence generators operates at a chip rate.

25. The receiver of claim 12 wherein samples corresponding to every four consecutive pilot symbols are processed to generate the phase error signal.

26. An integrated circuit (IC) configured to automatically correct frequency error of a local oscillator of a receiver, the IC comprising:
   an analog radio for converting a received radio frequency (RF) signal to a baseband signal using a signal generated by the local oscillator, the frequency of the local oscillator being controlled by a control voltage signal;
   an analog-to-digital converter (ADC) for generating samples of the baseband signal;
   an automatic frequency correction (AFC) unit comprising:
      a pilot code sequence generator for generating a pilot code sequence corresponding to a plurality of consecutive pilot symbols;
      a plurality of sliding window correlators for generating a complex correlation of samples and a pilot code sequence for each of the 4N consecutive pilot symbols, N being a positive integer;
      a plurality of phase vector generators, each phase vector generator generating a phase vector corresponding to a phase difference between two consecutive pilot symbols, thereby generating 2N phase vectors;
      a phase vector combiner for generating a combined phase vector by combining the 2N phase vectors, wherein in-phase and out-of-phase components from two antennas are added to generate the combined phase vector when space time transmit diversity (STTD) is used, and two successive phase vectors corresponding to a single antenna are added to generate the combined phase vector when STTD is not used; and
      a phase error estimator for generating the phase error signal based on the combined phase vector; and
   a control voltage generator in communication with the analog radio and the AFC unit, the control voltage generator for generating the control voltage signal based on the phase error signal.

27. The IC of claim 26 wherein the AFC unit further comprises:
   an averaging unit for averaging the phase error signal generated by the phase error estimator; and a loop filter for accumulating the averaged phase error signal, wherein the control voltage signal is generated based on the accumulated averaged phase error signal.

28. The IC of claim 26 wherein the AFC unit comprises a multipath combiner to combine phase vectors for a plurality of detected multipath components, and the phase error signal is generated based on the combined phase vectors over all detected multipath components.

29. The IC of claim 26 wherein the control voltage generator comprises:

a control voltage computation unit for generating a frequency correction value based on the phase error; and a digital-to-analog converter (DAC) for generating the control voltage signal based on the frequency correction value.

30. The IC of claim 26 wherein each of the pilot code sequence generators generates the pilot code sequence signal corresponding to an AFC reference cell.

31. The IC of claim 30 wherein the AFC reference cell is a high speed downlink packet access (HSDPA) serving cell on a condition that HSDPA service is active.

32. The IC of claim 30 wherein the AFC reference cell is a timing reference cell on a condition that high speed downlink packet access (HSDPA) service is not active.

33. The IC of claim 26 wherein space time transmit diversity (STTD) is used in transmission of the pilot symbols.

34. The IC of claim 33 wherein maximum ratio combining (MRC) is achieved without receiving a transmit diversity indication.

35. The IC of claim 33 wherein the STTD is implemented by Alamouti transmit diversity.

36. The IC of claim 26 wherein the pilot code sequence is a primary common pilot channel (CPICH) code sequence.

37. The IC of claim 26 wherein each of the pilot code sequence generators is reset every time a frame start signal indicates that a new frame is starting.

38. The IC of claim 26 wherein each of the pilot code sequence generators operates at a chip rate.

39. The IC of claim 26 wherein samples corresponding to every four consecutive pilot symbols are processed to generate the phase error signal.

* * * * *